United States Patent
Singh et al.

(10) Patent No.: US 9,613,909 B2
(45) Date of Patent: Apr. 4, 2017

(54) METHODS AND DEVICES FOR METAL FILLING PROCESSES

(71) Applicant: GLOBALFOUNDRIES Inc., Grand Cayman (KY)

(72) Inventors: Sunil Kumar Singh, Mechanicville, NY (US); Ravi Prakash Srivastava, Clifton Park, NY (US); Nicholas Robert Stokes, Halfmoon, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/824,181

(22) Filed: Aug. 12, 2015

(65) Prior Publication Data

US 2017/0047290 A1 Feb. 16, 2017

(51) Int. Cl.
*H01L 21/768* (2006.01)
*H01L 23/535* (2006.01)
*H01L 23/532* (2006.01)

(52) U.S. Cl.
CPC ........ *H01L 23/535* (2013.01); *H01L 21/7684* (2013.01); *H01L 21/76802* (2013.01); *H01L 21/76829* (2013.01); *H01L 21/76841* (2013.01); *H01L 21/76873* (2013.01); *H01L 21/76895* (2013.01); *H01L 23/53233* (2013.01); *H01L 23/53266* (2013.01)

(58) Field of Classification Search
CPC .................. H01L 21/76873; H01L 21/76849
See application file for complete search history.

(56) References Cited

U.S. PATENT DOCUMENTS

| | | | |
|---|---|---|---|
| 2007/0166982 A1* | 7/2007 | Preusse | C23C 18/31 438/597 |
| 2008/0213998 A1* | 9/2008 | Nagai et al. | C23C 14/14 438/653 |
| 2014/0061914 A1* | 3/2014 | Dyer et al. | H01L 23/53238 257/751 |
| 2015/0004784 A1* | 1/2015 | Yokoyama | H01L 21/76877 438/653 |
| 2015/0179511 A1* | 6/2015 | Hsieh | H01L 21/76877 438/675 |

* cited by examiner

*Primary Examiner* — Allen Parker
*Assistant Examiner* — Stephen Bradley
(74) *Attorney, Agent, or Firm* — Heslin Rothenberg Farley & Mesiti P.C.; Jacquelyn A Graff

(57) ABSTRACT

Metal filling processes for semiconductor devices and methods of fabricating semiconductor devices. One method includes, for instance: obtaining a wafer with at least one contact opening; depositing a metal alloy into at least a portion of the at least one contact opening; separating the metal alloy into a first metal layer and a second metal layer; depositing a barrier stack over the wafer; forming at least one trench opening; forming at least one via opening; and depositing at least one metal material into the trench openings and via openings. An intermediate semiconductor device is also disclosed.

12 Claims, 10 Drawing Sheets

METHODS AND DEVICES FOR METAL FILLING PROCESSES

FIELD OF THE INVENTION

The present invention relates to semiconductor devices and methods of fabricating semiconductor devices, and more particularly, to methods and devices for metal filling processes.

BACKGROUND OF THE INVENTION

As semiconductor devices continue to decrease in size, the size of trenches and vias continue to decrease. With smaller trenches and vias the semiconductor devices may experience gap filling issues resulting in, for example, line voids in the trenches and vias. These line voids may decrease the device yield and reliability and also increase defectivity. Thus, new methods and devices for metal filling are needed.

SUMMARY OF THE INVENTION

The shortcomings of the prior art are overcome and additional advantages are provided through the provision, in one aspect, a method includes obtaining a wafer with at least one contact opening; depositing a metal alloy into at least a portion of the at least one contact opening; separating the metal alloy into a first metal layer and a second metal layer; depositing a barrier stack over the wafer; forming at least one trench opening; forming at least one via opening; and depositing at least one metal material into the trench openings and via openings.

In another aspect, an intermediate semiconductor device is provided which includes, for instance: a substrate; at least one contact opening in the substrate; a first material in a bottom portion of the at least one contact opening; and at least one second material over the first material in a top portion of the at least one contact opening Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION OF THE INVENTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain semiconductor devices, for example, field-effect transistors (FETs), which provide advantages over the above noted, existing semiconductor devices and fabrication processes. Advantageously, the semiconductor device fabrication processes disclosed herein provide for devices with improved yield, defectivity, and reliability.

Figure 1:
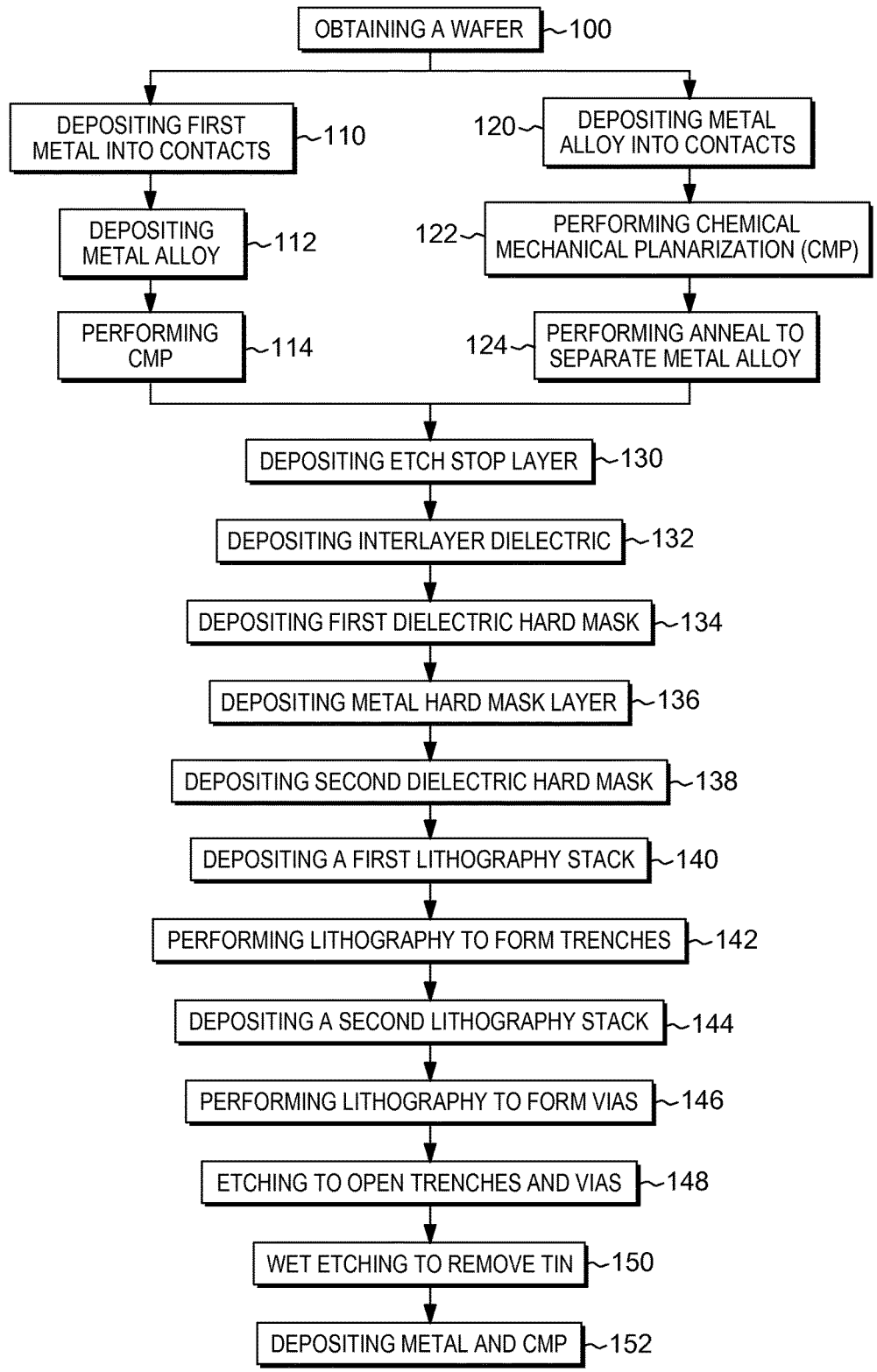
FIG. 1 depicts one embodiment of a method for metal filling process, in accordance with one or more aspects of the present invention.

In one aspect, in one embodiment, as shown in FIG. 1, the semiconductor device formation process in accordance with one or more aspects of the present invention may include, for instance: obtaining a wafer with contact openings 100; depositing a first metal into the contact openings 110; depositing a metal alloy over the wafer 112; performing chemical mechanical planarization (CMP) 114; depositing an etch stop layer 130; depositing an interlayer dielectric layer 132; depositing a first dielectric hard mask 134; depositing a metal hard mask layer 136; depositing a second dielectric hard mask 138; depositing a first lithography stack 140; performing lithography to form at least one trench 142; depositing a second lithography stack 144; performing lithography to form at least one via 146; etching to open the at least one trench and the at least one via 148; performing a wet etching to remove the metal hard mask layer 150; and depositing a metal layer and performing CMP 152.

In another aspect, in one embodiment, as shown in FIG. 1, the semiconductor device formation process in accordance with one or more aspects of the present invention may include, for instance: obtaining a wafer with contact openings 100; depositing a metal alloy into the contacts 120; performing CMP 122; performing an anneal to separate the metal alloy 124; depositing an etch stop layer 130; depositing an interlayer dielectric layer 132; depositing a first dielectric hard mask 134; depositing a metal hard mask layer 136; depositing a second dielectric hard mask 138; depositing a first lithography stack 140; performing lithography to form at least one trench 142; depositing a second lithography stack 144; performing lithography to form at least one via 146; etching to open the at least one trench and the at least one via 148; performing a wet etching to remove the metal hard mask layer 150; depositing a metal layer and performing CMP 152.

FIGS. 2-19 depict, by way of example only, several detailed embodiments of a portion of a semiconductor device formation process of FIG. 1 and an intermediate semiconductor device, in accordance with one or more aspects of the present invention. Note again that these figures are not drawn to scale in order to facilitate understanding of the invention, and that the same reference numerals used throughout different figures designate the same or similar elements.

Figure 2:
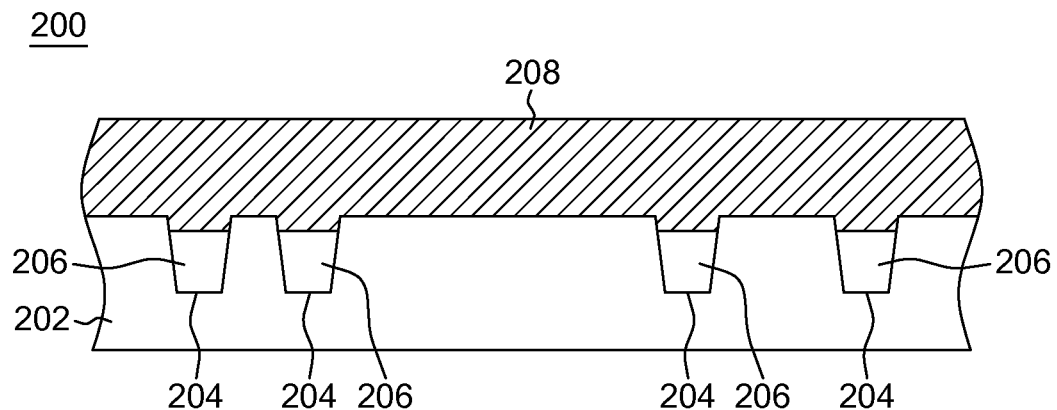
FIG. 2 depicts a cross-sectional elevation view of one embodiment of an integrated circuit with contacts disposed over a substrate structure and a first metal layer over the device, in accordance with one or more aspects of the present invention.
Figure 3:
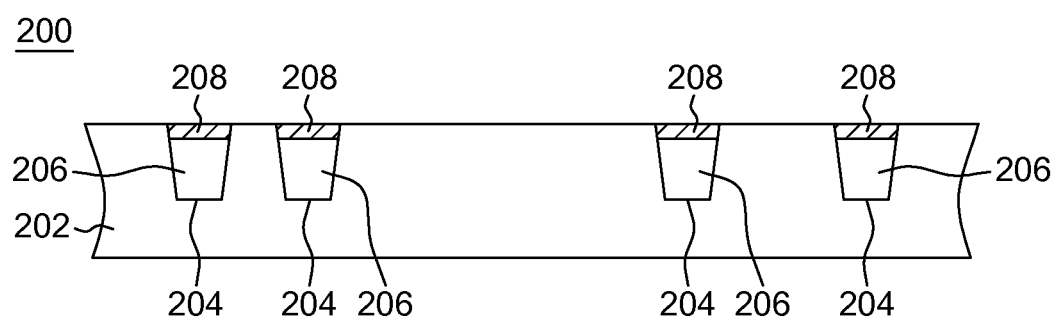
FIG. 3 depicts the cross-sectional elevation view of the semiconductor device of FIG. 2 after chemical mechanical planarization (CMP), in accordance with one or more aspects of the present invention.

One detailed embodiment of a portion of the semiconductor device formation process of FIG. 1 is depicted, by way of example only, in FIGS. 2-10. FIG. 2 shows a portion of a semiconductor device 200 obtained during the fabrication process. The device 200 may have been processed through initial device processing steps in accordance with the design of the device 200 being fabricated, for example, the device 200 may include, for example, a substrate 202 with at least one contact opening 204. The substrate 202 may in some embodiments have or be a substantially crystalline substrate material (i.e., bulk silicon), whereas in other embodiments, substrate 202 may be formed on the basis of a silicon-on-insulator (SOI) architecture. The at least one contact opening 204 may be filled with a metal 206, for example, tungsten (W). The device 200 may also include an alloy material layer 208, for example, copper manganese (CuMn). The device 200 may also include at least one isolation region (not shown), at least one fin (not shown), source regions (not shown), drain regions (not shown) and the like. Next, as shown in FIG. 3, a CMP may be performed to the alloy material layer 208 of the device 200.

Figure 4:
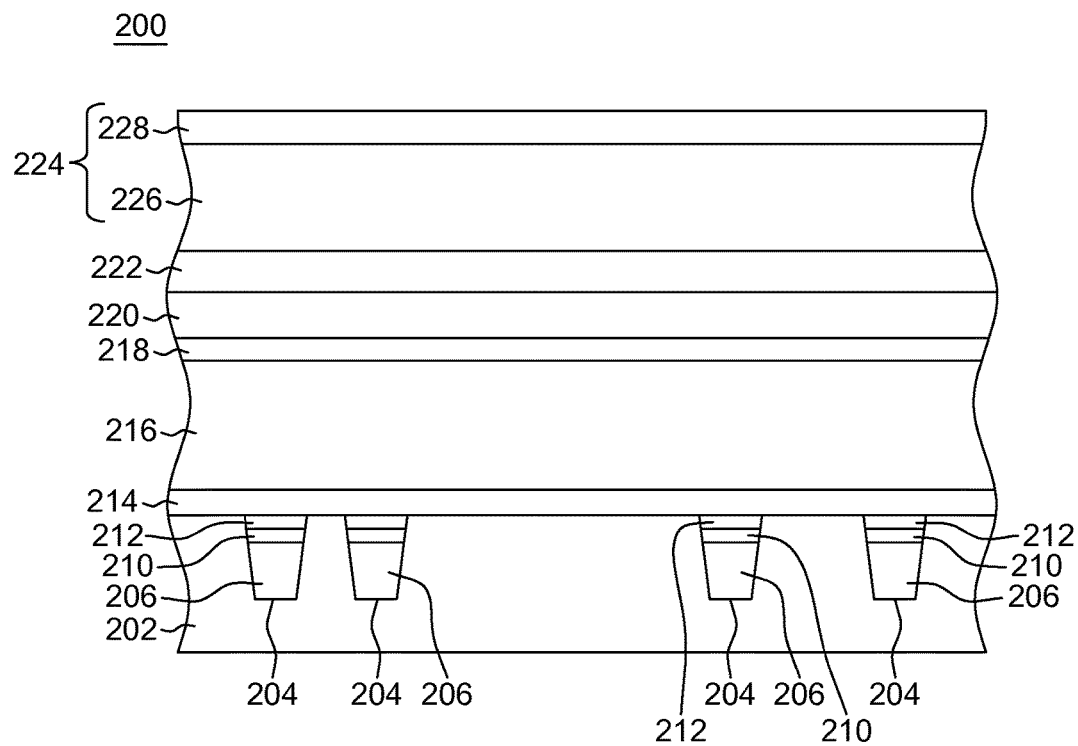
FIG. 4 depicts the cross-sectional elevation view of the semiconductor device of FIG. 3 after depositing an etch stop layer, an interlayer dielectric layer, a first dielectric hard mask, a metal hard mask layer, a second dielectric hard mask, and a first lithography stack, in accordance with one or more aspects of the present invention.

Referring now to FIG. 4, an etch stop layer 214 may be deposited over the device 200. Deposition of the etch stop layer 214 may cause the alloy material layer 208 to separate into a first metal layer 210 and a second metal layer 212. Where the alloy material layer 208 is CuMn, the first metal layer 210 may be, for example, a copper (Cu) layer, and the second metal layer 212 may be, for example, a manganese (Mn) layer. Then, an interlayer dielectric (ILD) layer 216 may be deposited over the etch stop layer 214. The ILD layer 216 may include, for example, silicon dioxide ($SiO_2$), silicon nitride (SiN), silicon oxynitride (SiON), and the like, or a combination of these commonly used dielectric materials. Next, a first dielectric hard mask 218 may be deposited over the ILD layer 216. A metal hard mask layer 220 may then be deposited over the first dielectric hard mask 218. The metal hard mask layer 220 may be, for example, titanium nitride (TiN). Then, a second dielectric hard mask 222 may be deposited over the metal hard mask layer 220. The first and second dielectric hard masks 218, 222 may act as a protective layers for the underlying layers during the device fabrication, for example, during an ashing process of a photoresist mask layer. The first and second dielectric hard masks 218, 222 may have an etch selectivity relative to at least the material including the upper surface portion of the ILD layer 216, such as silicon nitride (SiN), silicon oxynitride (SiON), silicon carbide (SiC), silicon carbonitride (SiCN), and the like. The dielectric hard masks 218, 222 may be formed above the contacts 204 by performing a suitable deposition process based on device parameters well known in the art, such as, chemical vapor deposition (CVD) process, a physical vapor deposition (PVD) process, atomic layer deposition (ALD), spin on coating, and the like. A first lithography stack 224 may be applied over the second dielectric hard mask 222 based on typical photolithography processes. The first lithography stack 224 may include, for example, a spin-on hardmask (SOH) layer 226, a SiON layer 228, a bottom anti-reflection coating (BARC) layer (not shown), and a photoresist layer (not shown).

Figure 5:
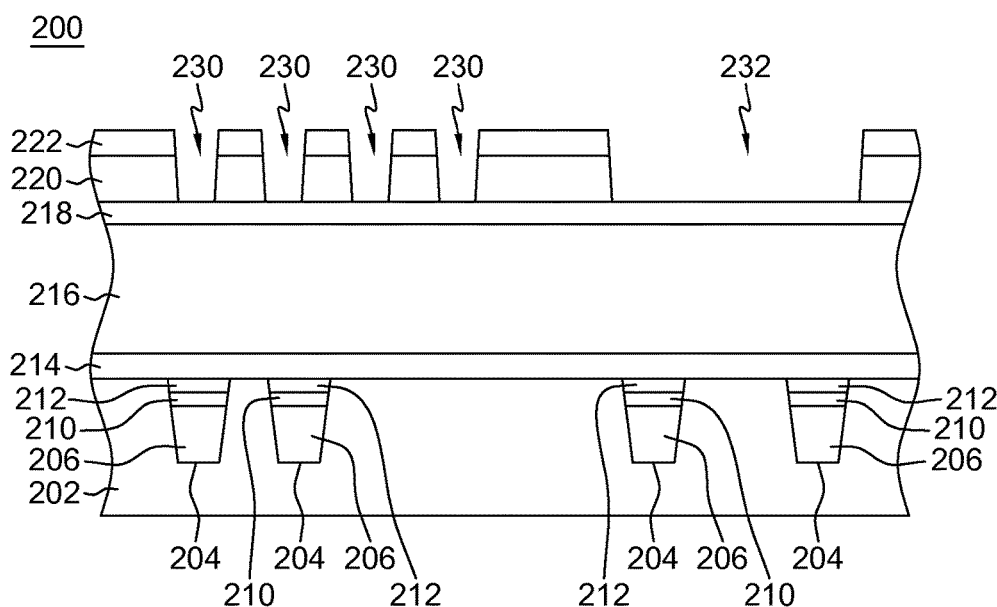
FIG. 5 depicts the cross-sectional elevation view of the semiconductor device of FIG. 4 after performing lithography to pattern trenches and etching to form the trenches, in accordance with one or more aspects of the present invention.
Figure 6:
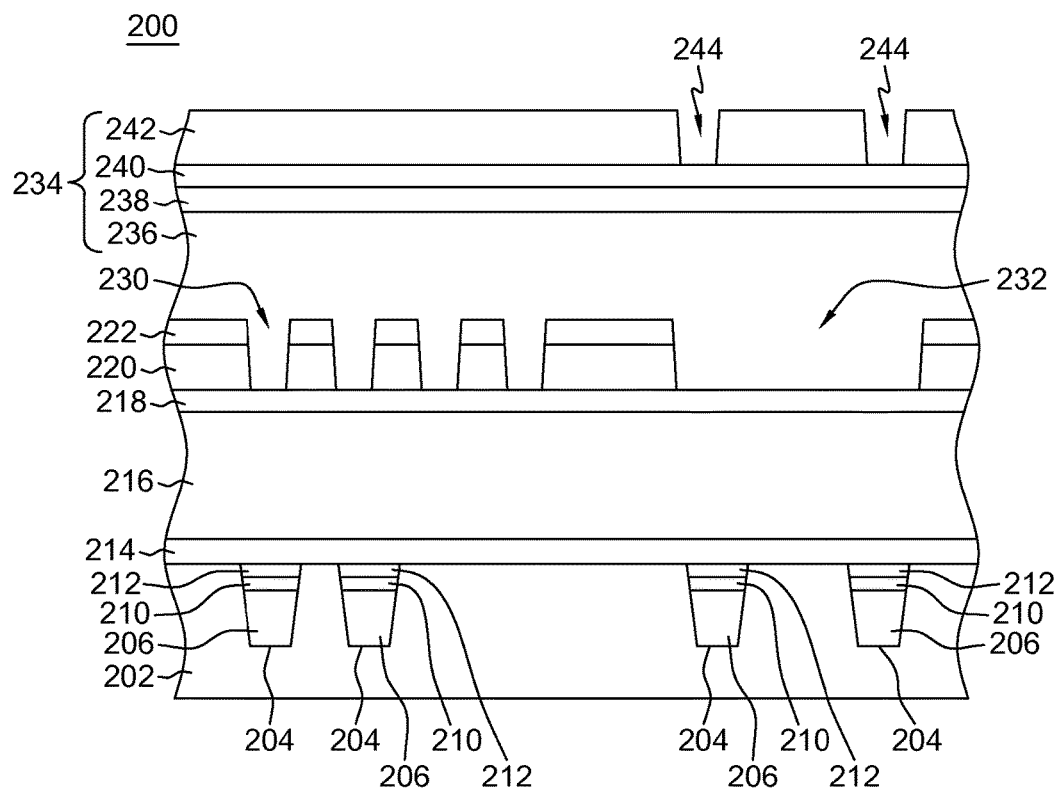
FIG. 6 depicts the cross-sectional elevation view of the semiconductor device of FIG. 5 after depositing a second lithography stack and performing lithography to pattern vias, in accordance with one or more aspects of the present invention.
Figure 7:
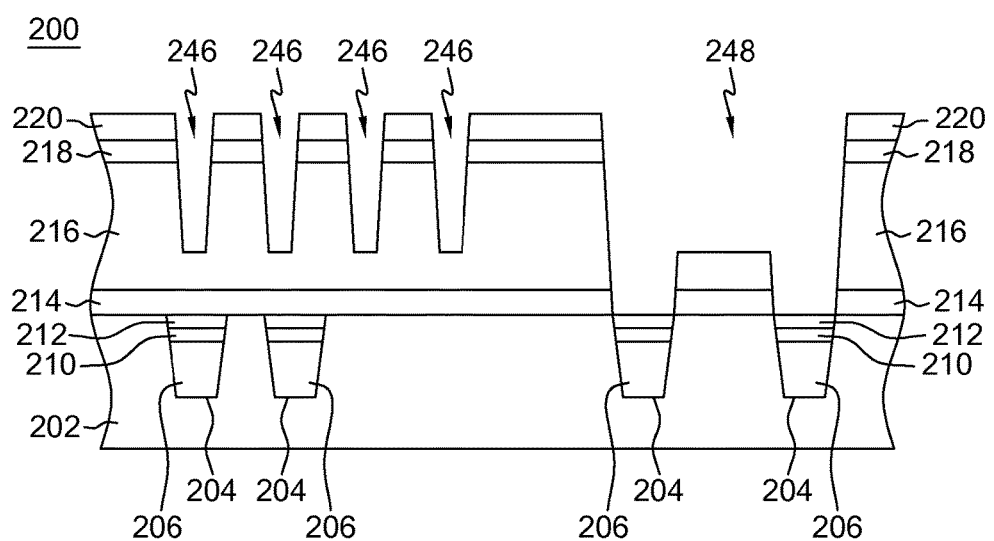
FIG. 7 depicts the cross-sectional elevation view of the semiconductor device of FIG. 6 after performing a full etch to open the trenches and vias, in accordance with one or more aspects of the present invention.
Figure 8:
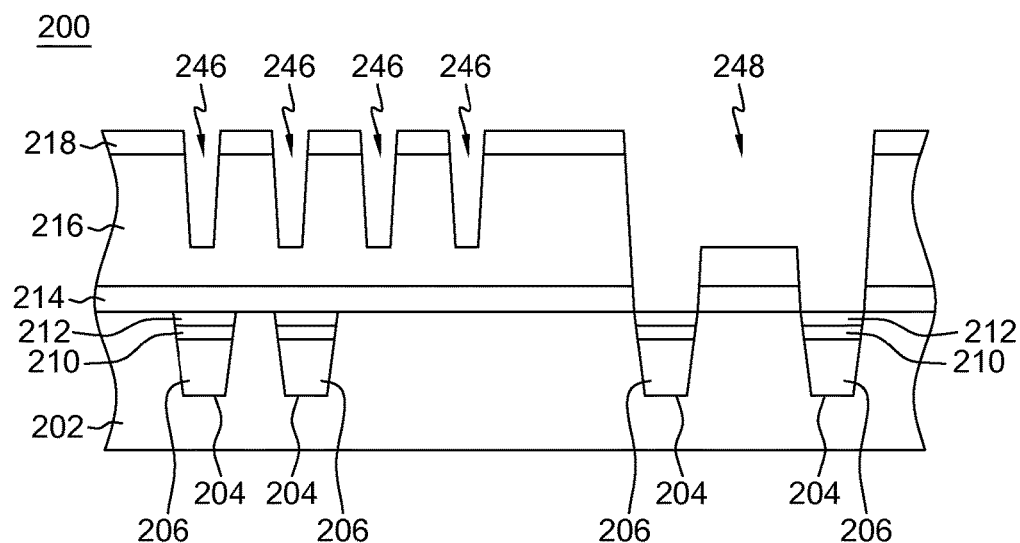
FIG. 8 depicts the cross-sectional elevation view of the semiconductor device of FIG. 7 after performing a wet etch clean to remove the titanium nitride (TiN), in accordance with one or more aspects of the present invention.

Next, as shown in FIG. 5, lithography may be performed to pattern and etch trenches or trench openings 230, 232 in the second dielectric hard mask 222 and the metal hard mask layer 220. Once the openings 230, 232 are formed any remaining portion of the first lithography stack 224 may be removed from the device. After the openings 230, 232 are formed, a second lithography stack 234 may be deposited over the device 200, as shown in FIG. 6. The second lithography stack 234 may include, for example, a SOH layer 236, a SiON layer 238, a BARC layer 240, and a photoresist layer 242. Lithography may then be performed to pattern the photoresist layer 242 to form via openings 244. After the via openings 244 are formed, a full etch may be performed to open the trench openings 246 and via openings 248, as shown in FIG. 7. The vias 248 may be, for example, etched down to contact at least one contact metal 206. A wet etch clean may then be performed over the device 200, to remove any of the remaining metal hard mask layer 220, as shown in FIG. 8.

Figure 9:
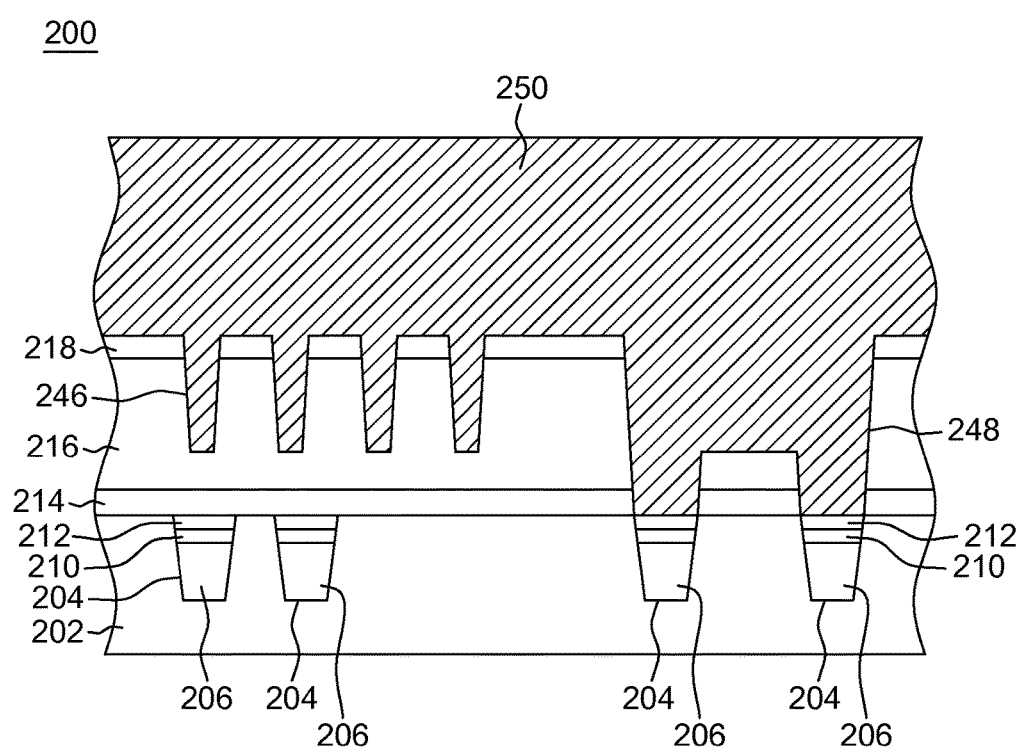
FIG. 9 depicts the cross-sectional elevation view of the semiconductor device of FIG. 8 after depositing a second metal, in accordance with one or more aspects of the present invention.
Figure 10:
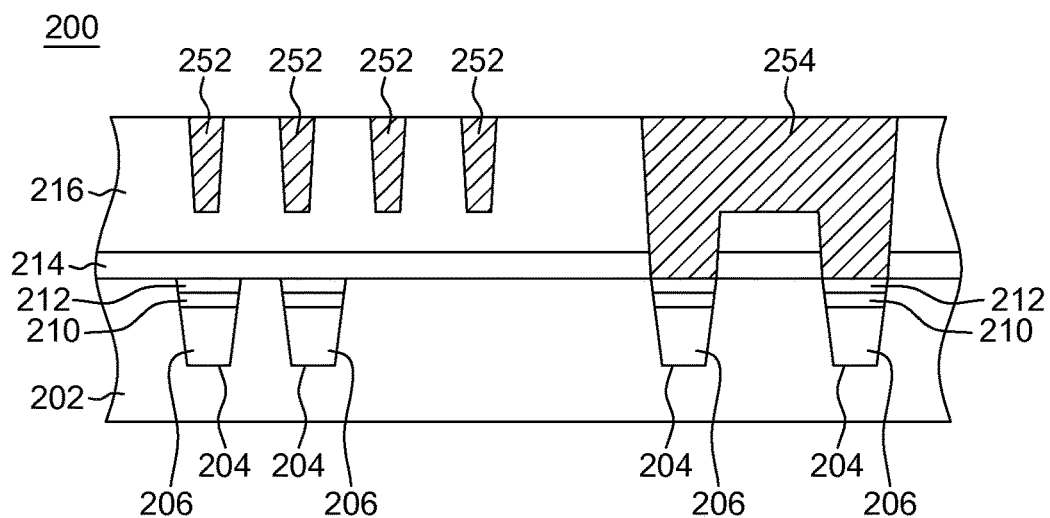
FIG. 10 depicts the cross-sectional elevation view of the semiconductor device of FIG. 9 after CMP, in accordance with one or more aspects of the present invention.

A metal deposition process may then be performed to deposit at least one metal layer 250 into the trench openings 246 and via openings 248, as shown in FIG. 9. The metal deposition process may be any suitable metal deposition process based known in the art. For example, the metal deposition process may include depositing a barrier layer (not shown) over the device 200 and into the trench openings 246 and via openings 248. Next the metal deposition process may include depositing a seed layer (not shown) over the barrier layer (not shown). Finally, the trench openings 246 and via openings 248 may be filled with a layer of conductive contact material 250 based on a substantially "bottom-up" deposition process well known to those skilled in the art, such as, a suitably designed electrochemical plating (ECP) process and the like, thereby reducing the likelihood of voids formed and/or trapped in the finished trenches 252 and vias 254, as shown in FIG. 10 after a CMP.

Figure 11:
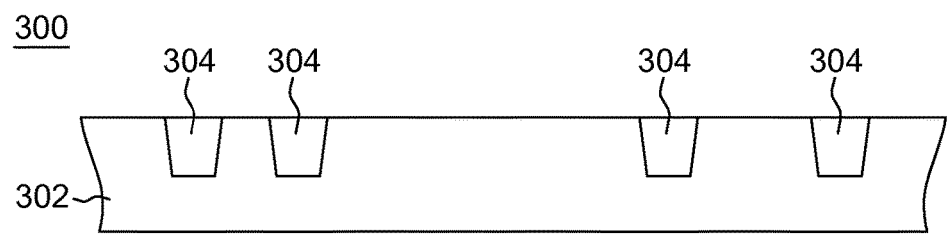
FIG. 11 depicts a cross-sectional elevation view of another embodiment semiconductor device with contacts disposed in a substrate structure, in accordance with one or more aspects of the present invention.
Figure 12:
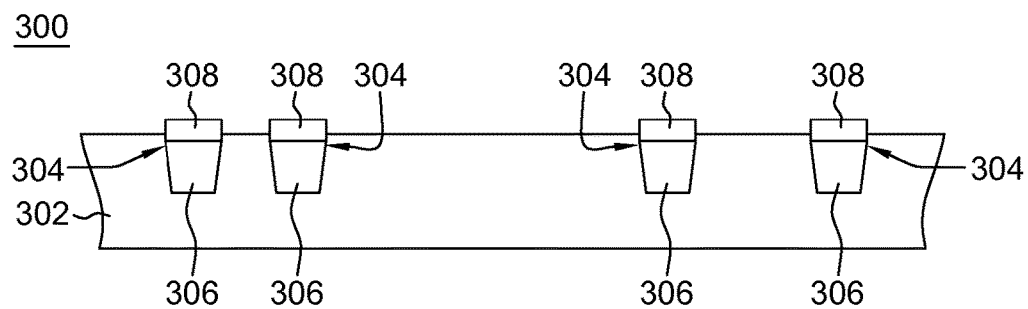
FIG. 12 depicts the cross-sectional elevation view of the semiconductor device of FIG. 11 after performing CMP and an anneal, in accordance with one or more aspects of the present invention.

Referring now to FIGS. 11-19, another detailed embodiment of a portion of the semiconductor device formation process of FIG. 1 is depicted. FIG. 11 shows a portion of a semiconductor device 300 obtained during the fabrication process. The device 300 may have been processed through initial device processing steps in accordance with the design of the device 300 being fabricated, for example, the device 300 may include, for example, a substrate 302 with at least one contact 304. The substrate 302 may in some embodiments have or be a substantially crystalline substrate material (i.e., bulk silicon), whereas in other embodiments, substrate 302 may be formed on the basis of a silicon-on-insulator (SOI) architecture. The at least one contact 304 may be, for example, a copper tungsten alloy (Cu—W) which has been deposited into the contact openings and a CMP performed to form the at least one contact 304. The Cu—W alloy may be, for example, deposited as a film by a direct current magnetron sputtering technique. The device 300 may also include at least one isolation region (not shown), at least one fin (not shown), source regions (not shown), drain regions (not shown) and the like. Next, as shown in FIG. 12, an anneal process may be performed to separate the two metals in the metal alloy filling the at least one contact 304. For example, the tungsten (W) and copper (Cu) may separate such that the W fills the bottom portion 306 of the contact opening and the Cu forms a layer 308 on the top of the contact opening over the W bottom portion 306. The anneal process may be, for example, a laser based anneal which causes a phase separation of the Cu and W.

Figure 13:
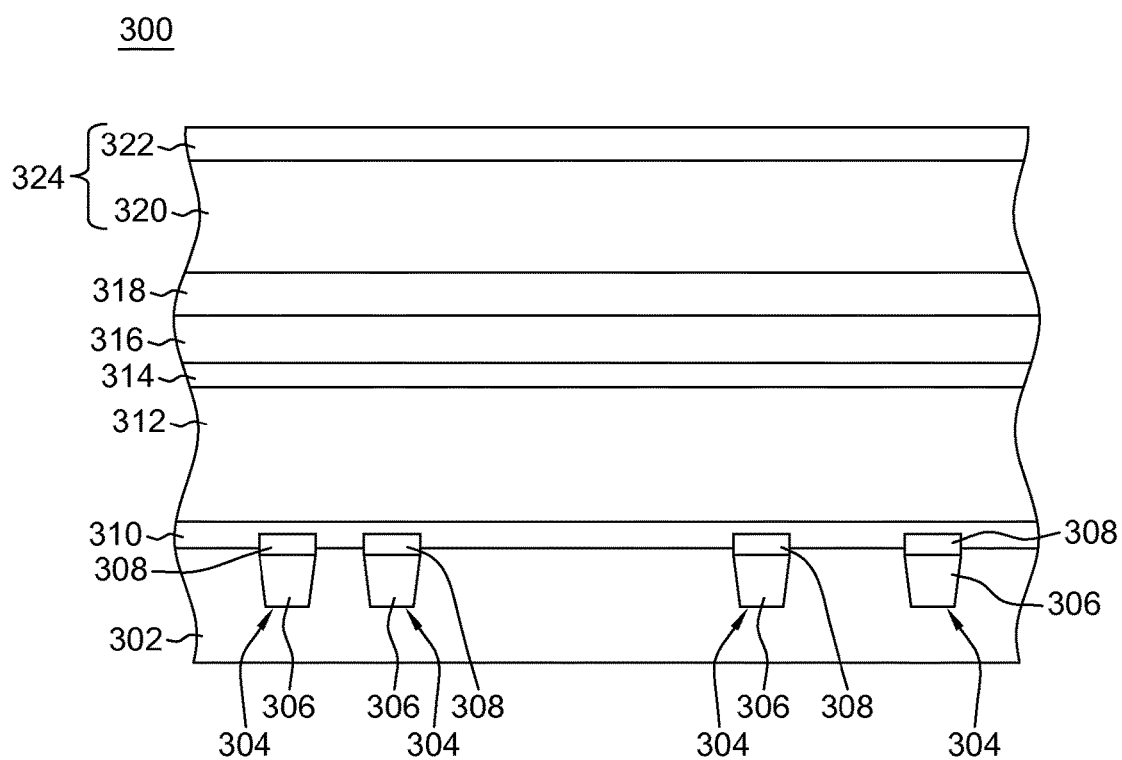
FIG. 13 depicts the cross-sectional elevation view of the semiconductor device of FIG. 12 after depositing an etch stop layer, an interlayer dielectric layer, a first dielectric hard mask, a metal hard mask layer, a second dielectric hard mask, and a first lithography stack, in accordance with one or more aspects of the present invention.

As shown in FIG. 13, an etch stop layer 310 may then be deposited over the device 300. Then, an interlayer dielectric (ILD) layer 312 may be deposited over the etch stop layer 310. The ILD layer 312 may include, for example, $SiO_2$, SiN, SiON, and the like, or a combination of these commonly used dielectric materials. Next, a first dielectric hard mask 314 may be deposited over the ILD layer 312. A metal hard mask layer 316 may then be deposited over the first dielectric hard mask 314. The metal hard mask layer 316 may be, for example, TiN. Then, a second dielectric hard mask 318 may be deposited over the metal hard mask layer 316. The first and second dielectric hard masks 314, 318 may act as a protective layers for the underlying layers during the device fabrication, for example, during an ashing process of a photoresist mask layer. The first and second dielectric hard masks 314, 318 may have an etch selectivity relative to at least the material including the upper surface portion of the ILD layer 312, such as SiN, SiON, SiC, SiCN, and the like. The dielectric hard masks 314, 318 may be formed above the contacts 304 by performing a suitable deposition process based on device parameters well known in the art, such as, CVD process, a PVD process, ALD process, spin on coating, and the like. A first lithography stack 324 may be applied over the second dielectric hard mask 318 based on typical photolithography processes. The first lithography stack 324 may include, for example, a SOH layer 320, a SiON layer 322, a BARC layer (not shown), and a photoresist layer (not shown).

Figure 14:
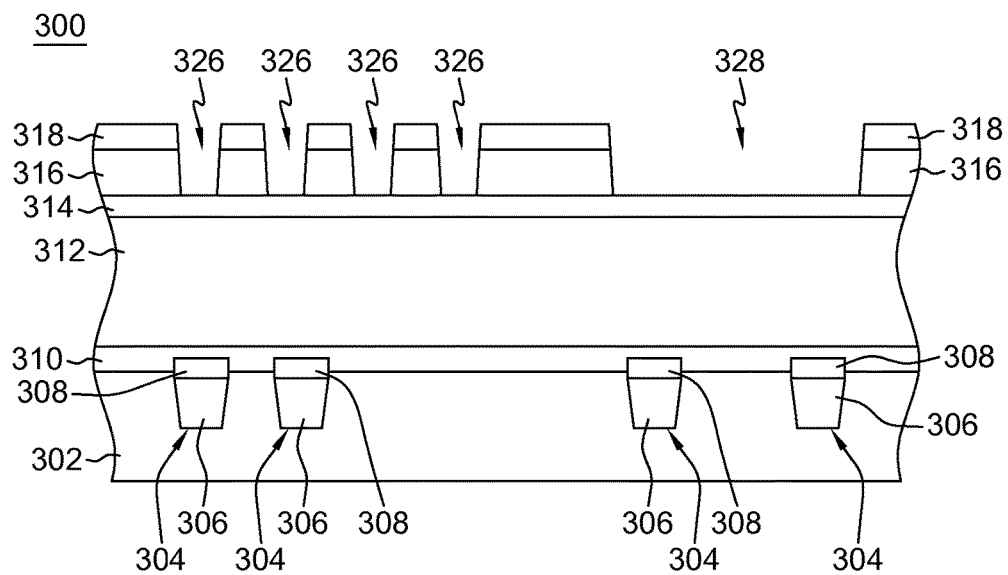
FIG. 14 depicts the cross-sectional elevation view of the semiconductor device of FIG. 13 after performing lithography to pattern trenches and etching to form the trenches, in accordance with one or more aspects of the present invention.
Figure 15:
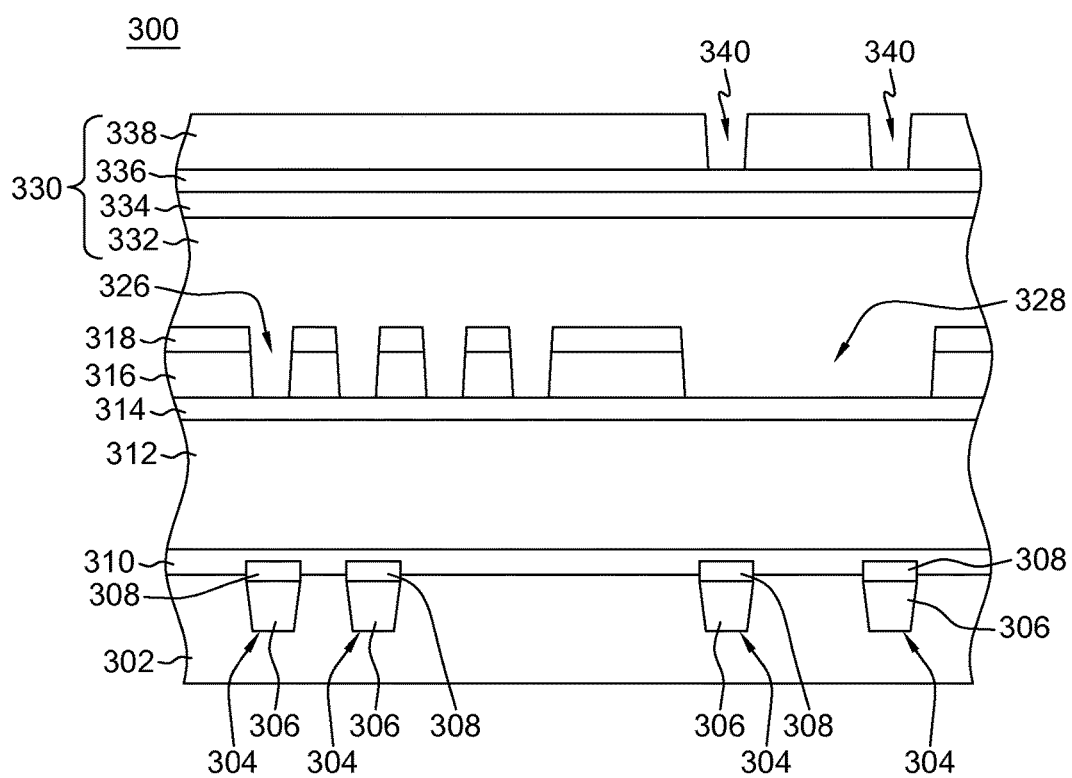
FIG. 15 depicts the cross-sectional elevation view of the semiconductor device of FIG. 14 after depositing a second lithography stack and performing lithography to pattern vias, in accordance with one or more aspects of the present invention.
Figure 16:
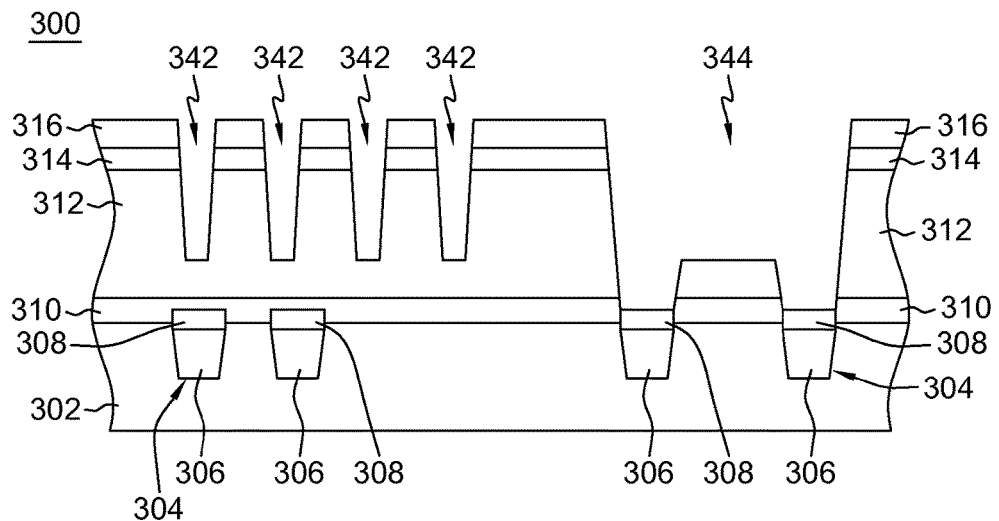
FIG. 16 depicts the cross-sectional elevation view of the semiconductor device of FIG. 15 after performing a full etch to open the trenches and vias, in accordance with one or more aspects of the present invention.
Figure 17:
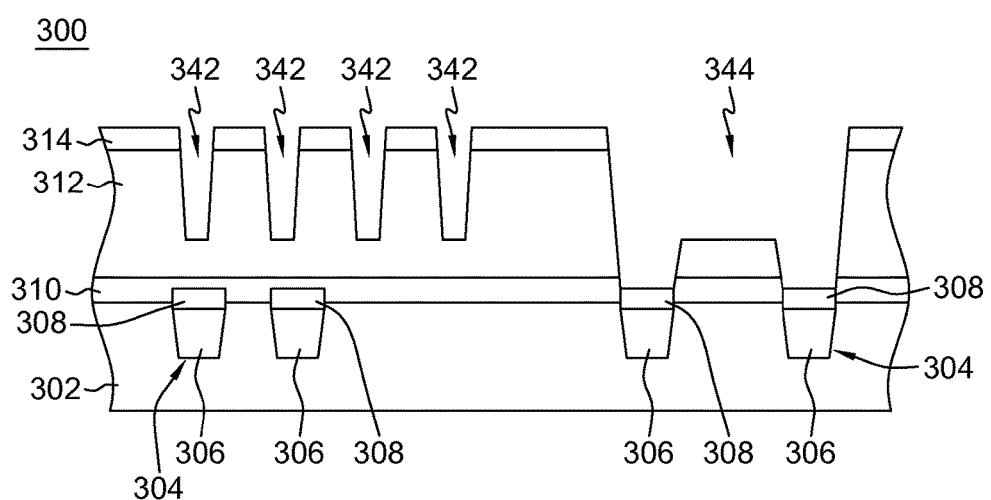
FIG. 17 depicts the cross-sectional elevation view of the semiconductor device of FIG. 16 after performing a wet etch clean to open the trenches and vias, in accordance with one or more aspects of the present invention.

Next, as shown in FIG. 14, lithography and etching may be performed to pattern and etch trenches or trench openings 326, 328 in the second dielectric hard mask 318 and the metal hard mask layer 316. Once the openings 326, 328 are formed any remaining portion of the first lithography stack 324 may be removed from the device 300. Then, a second lithography stack 330 may be deposited over the device 300, as shown in FIG. 15. The second lithography stack 330 may include, for example, a SOH layer 332, a SiON layer 334, a BARC layer 336, and a photoresist layer 338. Lithography and etching may then be performed to pattern the photoresist layer 338 to form via openings 340. After the via openings 340 are formed, a full etch may be performed to open the trench openings 326 and via openings 340, as shown in FIG. 16. The via openings 340 may be, for example, etched down to the Cu layer 308 of the at least one contact 304. A wet etch clean may then be performed over the device 300, to remove any of the remaining metal hard mask layer 316, as shown in FIG. 17.

Figure 18:
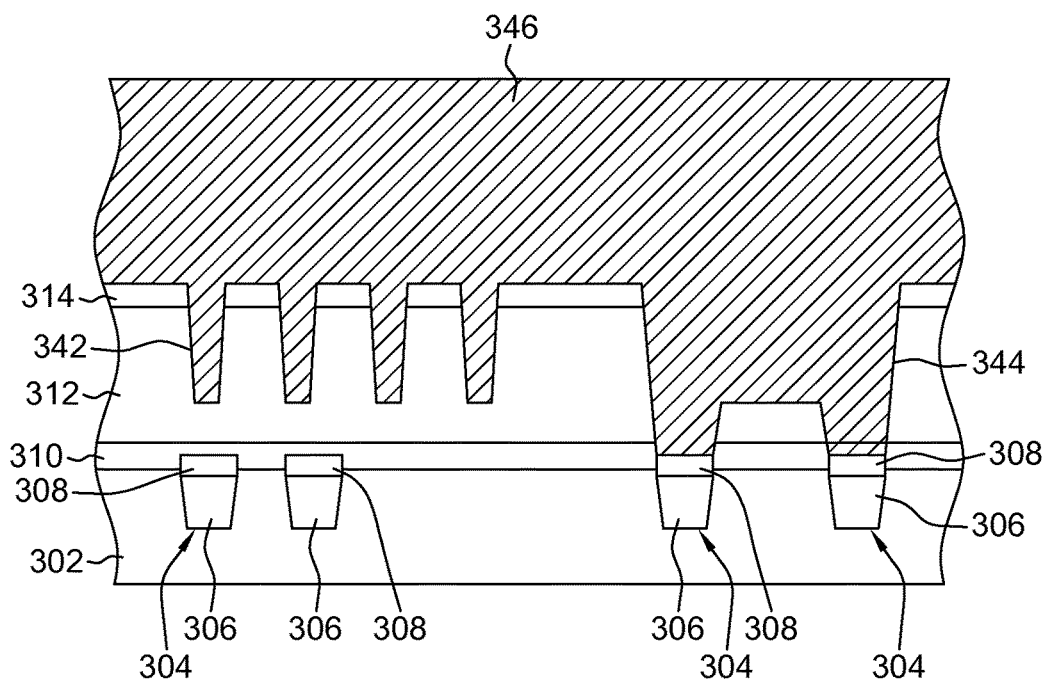
FIG. 18 depicts the cross-sectional elevation view of the semiconductor device of FIG. 17 after depositing a metal layer, in accordance with one or more aspects of the present invention.
Figure 19:
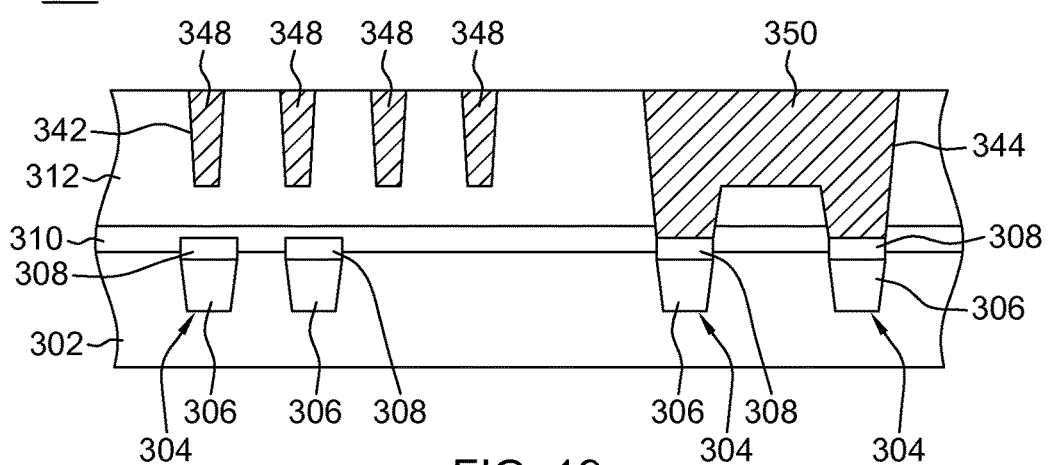
FIG. 19 depicts the cross-sectional elevation view of the semiconductor device of FIG. 18 after performing a CMP, in accordance with one or more aspects of the present invention.

A metal deposition process may then be performed to deposit at least one metal layer 346 into the trench openings 326 and via openings 340, as shown in FIG. 18. The metal deposition process may be any suitable metal deposition process based known in the art. For example, the metal deposition process may include depositing a barrier layer (not shown) over the device 300 and into the trench openings 326 and via openings 340. Next the metal deposition process may include depositing a seed layer (not shown) over the barrier layer (not shown). Finally, the trench openings 326 and via openings 340 may be filled with a layer of conductive contact material 346 based on a substantially "bottom-up" deposition process well known to those skilled in the art, such as, a suitably designed ECP process and the like, thereby reducing the likelihood of voids formed and/or trapped in the finished trenches 348 and vias 350, as shown in FIG. 19 after CMP processing.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   obtaining a wafer with at least one contact opening, and wherein the at least one contact opening includes two sidewalls and a bottom surface;
   depositing a metal within the at least one contact opening, and wherein the metal extends between the two sidewalls and from the bottom surface to a point below a top surface of the wafer filling a portion of the at least one contact opening;
   depositing a separate layer of a metal alloy into at least a portion of the at least one contact opening directly over said metal, and wherein the metal alloy extends between the two sidewalls;
   separating the metal alloy into a first metal layer and a second metal layer, each located over said metal, wherein the first metal layer of the metal alloy is directly over the metal and the second metal layer of the metal alloy is directly over the first metal layer of the metal alloy;
   depositing a barrier stack over the wafer;
   forming at least one trench opening;
   forming at least one via opening; and
   depositing at least one metal material into the trench openings and via openings.

2. The method of claim 1, wherein depositing the barrier stack comprises:
   depositing an etch stop layer;
   depositing an interlayer dielectric layer;
   depositing a first dielectric hard mask;
   depositing a metal hard mask layer; and
   depositing a second dielectric hard mask.

3. The method of claim 1, wherein forming at least one trench opening comprises:
   depositing a first lithography stack over the barrier stack;
   performing a first lithography to pattern the at least one trench opening; and
   etching to form the at least one trench opening.

4. The method of claim 1, wherein forming at least one via opening comprises:
   depositing a second lithography stack over the barrier stack;
   performing a second lithography to pattern the at least one via opening; and
   etching to form the at least one via opening.

5. The method of claim 1, wherein
   depositing a metal into the at least one contact opening occurs prior to depositing the separate layer of the metal alloy and wherein the metal includes a first thickness and the separate layer of the metal alloy includes a second thickness, the second thickness being less than the first thickness.

6. The method of claim 5, wherein separating the metal alloy into the first metal layer and the second metal layer comprises:
   performing chemical mechanical planarization over the metal alloy; and
   depositing an etch stop layer over the wafer separating the metal alloy into the first metal layer and the second metal layer.

7. The method of claim 5, wherein the metal is tungsten and the metal alloy is copper manganese.

8. The method of claim 7, wherein the first metal layer is copper and the second metal layer is manganese.

9. The method of claim 1, wherein separating the metal alloy into the first metal layer and the second metal layer comprises:
   depositing the metal alloy to fill the at least one contact opening;
   performing chemical mechanical planarization over the metal alloy; and
   performing an anneal to separate the metal alloy into the first metal layer and the second metal layer.

10. The method of claim 9, wherein the metal alloy is copper tungsten.

11. The method of claim 10, wherein the first metal layer is tungsten and the second metal layer is copper.

12. The method of claim 1, wherein depositing the at least one metal material into the trench openings and the via openings comprises:
    depositing a barrier layer over the wafer and into the trench openings and the via openings;
    depositing a seed layer over the barrier layer; and
    performing an electrochemical plating process to fill the trench openings and the via openings.

* * * * *